(12) United States Patent
Lee et al.

(10) Patent No.: US 9,991,308 B2
(45) Date of Patent: Jun. 5, 2018

(54) IMAGE SENSOR

(71) Applicant: Samsung Electronics Co., Ltd., Suwon-si, Gyeonggi-do (KR)

(72) Inventors: Choong Jae Lee, Hwaseong-si (KR); Oh Kyum Kwon, Suwon-si (KR); Myoung Kyu Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/455,361

(22) Filed: Mar. 10, 2017

(65) Prior Publication Data

US 2018/0061882 A1    Mar. 1, 2018

(30) Foreign Application Priority Data

Aug. 24, 2016 (KR) ........................ 10-2016-0107445

(51) Int. Cl.
*H01L 27/146* (2006.01)

(52) U.S. Cl.
CPC .. *H01L 27/14645* (2013.01); *H01L 27/14612* (2013.01); *H01L 27/14621* (2013.01); *H01L 27/14627* (2013.01); *H01L 27/14634* (2013.01); *H01L 27/14636* (2013.01)

(58) Field of Classification Search
CPC ......... H01L 27/14632; H01L 27/14634; H01L 27/14636; H01L 27/14643
See application file for complete search history.

(56) References Cited

U.S. PATENT DOCUMENTS

| | | | |
|---|---|---|---|
| 4,543,597 A | * | 9/1985 | Shibata ............... H01L 27/0255 257/296 |
| 5,650,651 A | | 7/1997 | Bui |
| 6,110,841 A | | 8/2000 | Wang et al. |
| 6,277,723 B1 | | 8/2001 | Shih et al. |
| 6,423,653 B1 | | 7/2002 | Fu et al. |
| 6,642,081 B1 | | 11/2003 | Patti |
| 6,979,868 B2 | | 12/2005 | Chen et al. |

(Continued)

FOREIGN PATENT DOCUMENTS

| JP | 5664205 B2 | 2/2015 |
|---|---|---|
| KR | 20100077589 A | 7/2010 |

*Primary Examiner* — Mark Prenty
(74) *Attorney, Agent, or Firm* — Harness, Dickey & Pierce, P.L.C.

(57) ABSTRACT

An image sensor includes a first semiconductor layer having a first semiconductor region and a first insulating region, and a second semiconductor layer under the first semiconductor layer including a second semiconductor region and a second insulating region. The first semiconductor layer includes a first transistor having first source or drain regions in the first semiconductor region and a first gate electrode in the first insulating region, a contact wiring, a first wiring layer electrically connecting the contact wiring and the first transistor, and a first junction region electrically connected to the first wiring layer. The second semiconductor layer includes a second transistor having second source or drain regions in the second semiconductor region and a second gate electrode in the second insulating region, a second wiring layer electrically connecting the contact wiring and the second transistor, and a second junction region electrically connected to the second wiring layer.

15 Claims, 16 Drawing Sheets

(56) References Cited

U.S. PATENT DOCUMENTS

| | | |
|---|---|---|
| 7,116,608 B2 | 10/2006 | Chou et al. |
| 8,114,694 B2 | 2/2012 | Kim |
| 8,129,843 B2 | 3/2012 | Arnold et al. |
| 8,264,065 B2 | 9/2012 | Su et al. |
| 8,514,308 B2 | 8/2013 | Itonaga et al. |
| 8,742,524 B2 | 6/2014 | Itonaga et al. |
| 9,087,760 B2 | 7/2015 | Itonaga et al. |
| 2014/0217542 A1 | 8/2014 | Itonaga et al. |

* cited by examiner

IMAGE SENSOR

This application claims the benefit of priority from Korean Patent Application No. 10-2016-0107445, filed on Aug. 24, 2016, in the Korean Intellectual Property Office, the disclosure of which is incorporated herein in s entirety by reference.

BACKGROUND

1. Technical Field

Some example embodiments of the inventive concepts relate to an image sensor.

2. Description of the Related Art

An image sensor is a device that converts an optical image into an electrical signal, With recent advancements in computer and communication industries, the demand for image sensors with enhanced performance is increasing in various fields such as digital cameras, camcorders, personal communication systems, game devices, security cameras, microcameras for medical use, and robots.

SUMMARY

Some example embodiments of the inventive concepts provide a stack-type image sensor in which degradation of analog circuits by fine noise is reduced or prevented by removing electric charges generated by plasma etching using a junction region disposed in an upper semiconductor layer, and by removing the electric charges generated by the plasma etching using a junction region disposed in a lower semiconductor layer.

Some example embodiments of the inventive concepts also provide a stack-type image sensor in which electric charges generated when a wiring layer is formed using plasma etching are removed by a junction region.

However, Some example embodiments of the inventive concepts are not restricted to the one set forth herein. The above and other example embodiments of the inventive concepts will become more apparent to one of ordinary skill in the art to which the inventive concepts pertains by referencing the detailed description of the inventive concepts given below.

According to an example embodiment of the inventive concepts, a first semiconductor layer includes a first semiconductor region containing a semiconductor material and a first insulating region containing an insulating material, and a second semiconductor layer which is disposed under the first semiconductor layer and includes a second semiconductor region containing the semiconductor material and a second insulating region containing the insulating material, wherein the first semiconductor layer includes a first transistor which includes first source or drain regions disposed in the first semiconductor region and a first gate electrode disposed in the first insulating region, a contact wiring which penetrates the first semiconductor layer, a first wiring layer which electrically connects the contact wiring and the first transistor and is disposed in the first insulating region and a first junction region which is disposed in the first semiconductor region and electrically connected to the first wiring layer, wherein the second semiconductor layer includes a second transistor which includes second source or drain regions disposed in the second semiconductor region and a second gate electrode disposed in the second insulating region, a second wiring layer which electrically connects the contact wiring and the second transistor and is disposed in the second insulating region and a second junction region which is disposed in the second semiconductor region and electrically connected to the second wiring layer.

According to an example embodiment the inventive concepts, a first semiconductor layer includes a first semiconductor region containing a semiconductor material and a first insulating region containing an insulating material, a second semiconductor layer includes a second semiconductor region containing the semiconductor material and a second insulating region containing the insulating material and disposed adjacent to the first insulating region, and a contact wiring which electrically connects the first semiconductor layer and the second semiconductor layer, wherein the first semiconductor layer includes a first wiring layer which is disposed in the first insulating region, a first junction region which is disposed in the first semiconductor region and electrically connected to the first wiring layer and first source or drain regions which are disposed in the first semiconductor region and electrically connected to the first wiring layer, wherein the second semiconductor layer includes a second wiring layer which is disposed in the second insulating region, a second junction region which is disposed in the second semiconductor region and electrically connected to the second wiring layer and second source or drain regions which are disposed in the second semiconductor region and electrically insulated from the second wiring layer.

Other features and example embodiments may be apparent from the following detailed description, the drawings, and the claims.

In some example embodiments, an image sensor includes a first semiconductor layer having a first transistor, a first wiring layer and a first junction region, and a second semiconductor layer having a second transistor, a second wiring layer and a second junction region, the second semiconductor layer being in electrical contact with the first semiconductor layer via a contact wiring, the contact wiring being in electrical contact with the first and second transistors via the first and second wiring layers, respectively, and at least one of the first and second junction regions being configured to absorb electric charges generated via formation of the contact wiring.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Unless otherwise defined, all terms (including technical and scientific terms) used herein have the same meaning as commonly understood by one of ordinary skill in the art to which this inventive concepts belong. It will be further understood that terms, such as the terms defined in commonly used dictionaries, should be interpreted as having a meaning that is consistent with their meaning in the context of the relevant art and will not be interpreted in an idealized or overly formal sense unless expressly so defined herein.

A schematic planar layout of an image sensor according to some example embodiments will now be described with reference to FIG. 1.

Figure 1:
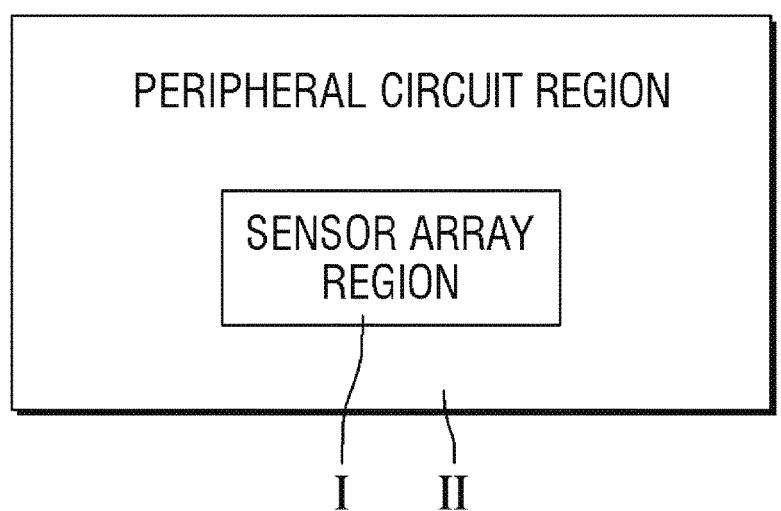
FIG. 1 is a schematic plan view of an image sensor according to some example embodiments.

FIG. 1 is a schematic plan view of an image sensor according to some example embodiments.

Referring to FIG. 1, the image sensor may include a sensor array region I, a peripheral circuit region II which includes a plurality of circuits formed around the sensor array region I, and a pad region which includes a plurality of pads disposed around the peripheral circuit region II.

The sensor array region I may include an active pixel sensor (APS) array region which includes active pixels configured to generate active signals corresponding wavelengths of incident light and an optical black sensor region which is blocked from incident light to generate an optical black signal.

A dummy pixel region may be disposed in an edge part of the APS array region which is adjacent to the optical black sensor region. However, the inventive concepts are not limited thereto. That is, in other example embodiments, the dummy pixel region may be omitted.

In some example embodiments, the pads formed in the pad region may exchange electrical signals with an external device. In some example embodiments, the pads may deliver a driving power source such as a power supply voltage or a ground voltage supplied from an external source to the circuits disposed in the peripheral circuit region II.

The APS array region includes active pixel sensor arrays including a plurality of unit pixels. Each or at least one of the unit pixels may include a photoelectric conversion device.

The peripheral circuit region II may include a plurality of complementary metal oxide semiconductor (CMOS) transistors and provide a specific signal to each unit pixel of the APS array region or control an output signal of each unit pixel.

An image sensor according to some example embodiments will now be described with reference to FIG. 2.

Figure 2:
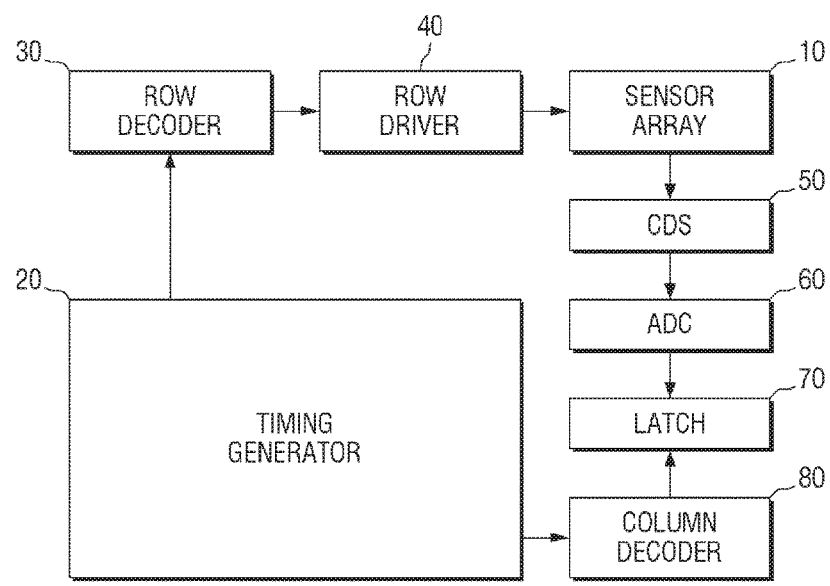
FIG. 2 is a block diagram of an image sensor according to some example embodiments.

FIG. 2 is a block diagram of an image sensor according to some example embodiments.

Referring to FIG. 2, the image sensor according to the example embodiments includes an APS array 10 which includes two-dimensional arrays of pixels having photoelectric conversion devices, a timing generator 20, a row decoder 30, a row driver 40, a correlated double sampler (CDS) 50, an analog-to-digital converter (ADC) 60, a latch 70, and a column decoder 80.

The APS array 10 includes a plurality of unit pixels arranged in two dimensions. The unit pixels may convert optical images into electrical output signals.

The APS array 10 may be driven by multiple driving signals (such as a row selection signal, a reset signal, and a charge transmission signal) transmitted from the row driver 40. Also, the electrical output signals may be delivered to the CDS 50 through vertical signal lines.

The timing generator 20 may provide a timing signal and a control signal to the row decoder 30 and the column decoder 80.

According to the decoding result of the row decoder 30, the row driver 40 may provide the APS array 10 with multiple driving signals to drive the unit pixels. In general, in case of the unit pixels arranged in a matrix fashion, the driving signals may be provided to each row.

The CDS 50 may receive the output signals from the APS array 10 through vertical signal lines and perform hold and sampling operations. That is, the CDS 50 may double-sample a certain noise level and signal levels of the output signals and output difference levels between the noise level and the signal levels.

The ADS 60 may convert analog signals corresponding to the difference levels into digital signals and output the digital signals.

The latch 70 may latch the digital signals and send, for example, sequentially send, the latched signals to an image signal processor (not shown) according to the decoding result of the column decoder 80.

An equivalent circuit diagram of a sensor array according to some example embodiments will now be described with reference to FIG. 3.

Figure 3:
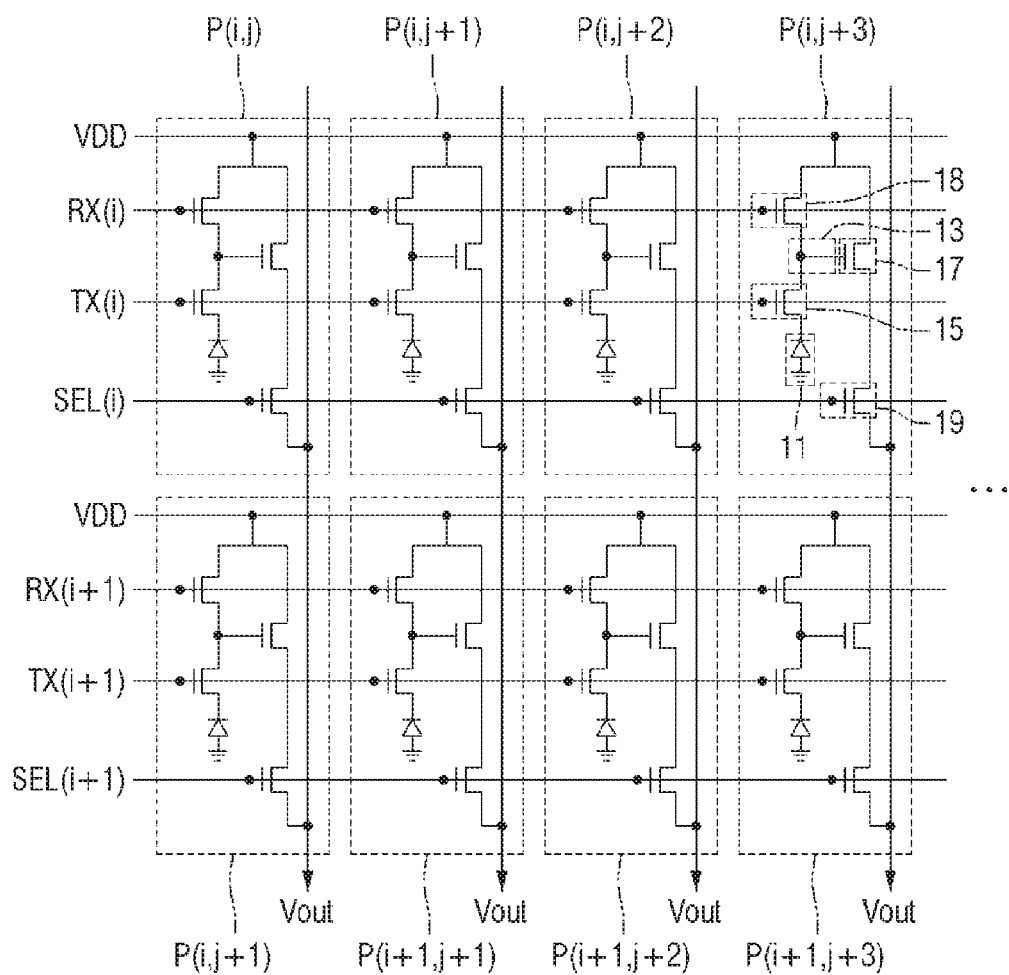
FIG. 3 is an equivalent circuit diagram of a sensor array according to some example embodiments.

FIG. 3 is an equivalent circuit diagram of a sensor array according to some example embodiments.

Referring to FIG. 3, pixels P are arranged in a matrix fashion to form an APS array 10. Each, or one or more, of the pixels P includes a photoelectric conversion device 11, a floating diffusion (FD) region 13, a charge transmission device 15, a drive device 17, a reset device 18, and a selection device 19. The functionality of these devices will be described using an $i^{th}$ row of pixels (P(i, j), P(i, j+1), P(i, j+2), P(i, j+3), . . . ) as an example.

The photoelectric conversion device 11 may absorb incident light and accumulate electric charges corresponding to the amount of the incident light. The photoelectric conversion device 11 may be a photodiode, a phototransistor, a photogate, a pinned photodiode, or a combination of the same. In FIG. 3, a photodiode is shown.

The photoelectric conversion device 11 may be coupled to the charge transmission device 15 which transmit the accumulated electric charges to the FD region 13.

The FD region 13 is a region that converts electric charges into voltages. Since the FD region 13 has parasitic capacitances, the electric charges may be cumulatively stored in the FD region 13.

The drive device 17, exemplified as a source follower amplifier, may amplify a change in an electric potential of the FD region 13, which receives the electric charges accumulated in the photoelectric conversion device 11, and output the amplified change to an output line Vout.

The reset device 18 may periodically reset the FD region 13. The reset device 18 may be composed of a metal oxide semiconductor (MOS) transistor driven by a bias (i.e., a reset signal) provided by a reset line RX(i).

When the reset device 18 is turned on by the bias provided by the reset line RX(i), an electric potential (e.g., a power supply voltage VDD) provided to a drain of the reset device 18 may be delivered to the FD region 13.

The selection device 19 may select a pixel P to be read in each row. The selection device 19 may be composed of a MOS transistor driven by a bias (i.e., a row selection signal) provided by a row selection line SEL(i).

When the selection device 19 is turned on by the bias provided by the row selection line SEL(i), an electric potential (e.g., the power supply voltage VDD) provided to a drain of the selection device 19 may be delivered to a drain of the drive device 17.

A transmission line TX(i) which may be configured to apply a bias to the charge transmission device 15, the reset line RX(i) which may be configured to apply a bias to the reset device 18, and the row selection line SEL(i) which may be configured to apply a bias to the selection device 19 may extend substantially parallel to each other in a row direction.

An image sensor according to an example embodiment will now be described with reference to FIG. 4.

Figure 4:
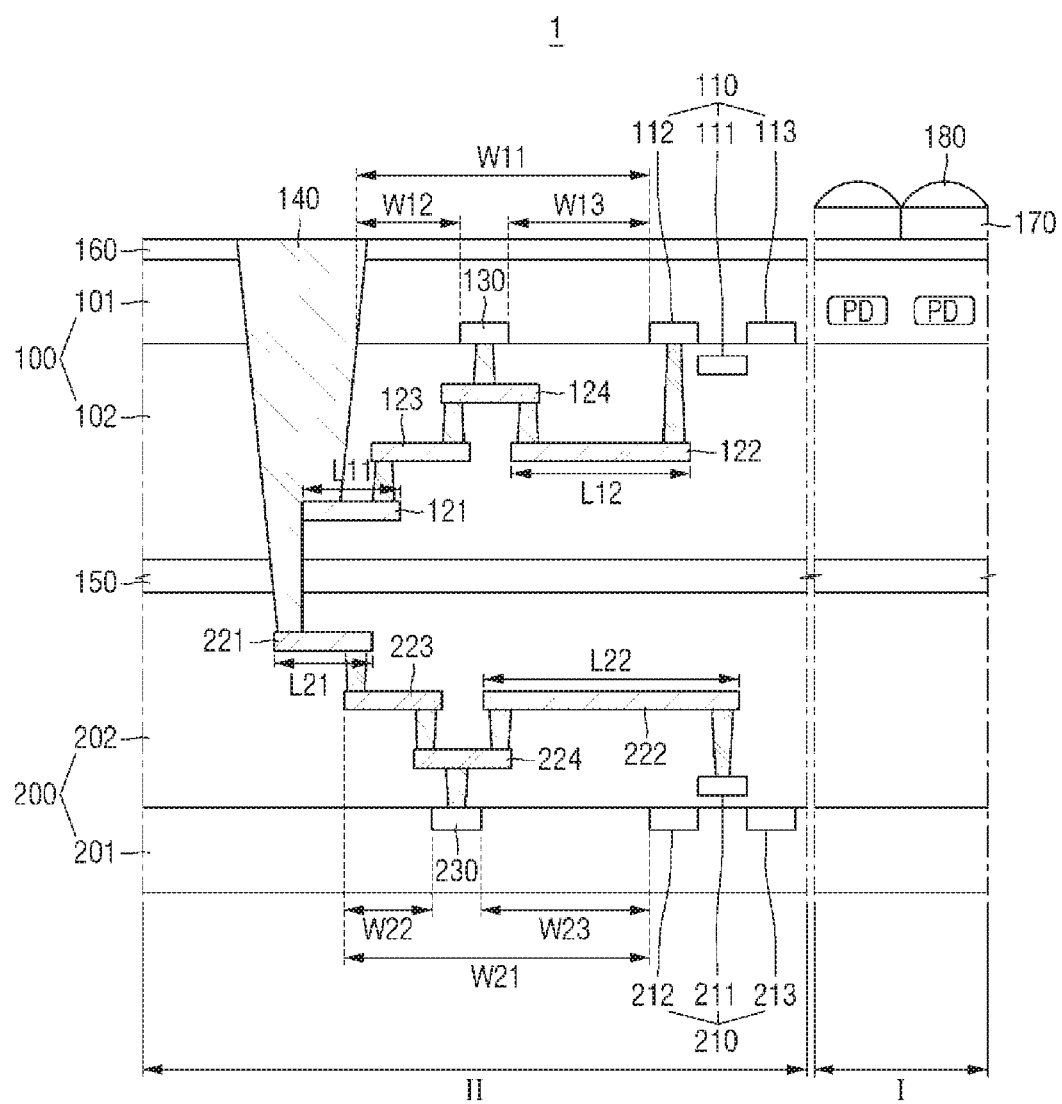
FIG. 4 illustrates an image sensor according to an example embodiment.

FIG. 4 illustrates an image sensor 1 according to an example embodiment.

Referring to FIG. 4, the image sensor 1 includes a sensor array region I and a peripheral circuit region II.

The sensor array region I is a region in which the APS array 10 of FIG. 2 is formed.

The peripheral circuit region II is a region in which the CDS 50 of FIG. 2 is formed. The peripheral circuit region II may surround the sensor array region I, but the inventive concepts are not limited thereto.

The peripheral circuit region II may include a plurality of CMOS transistors 110 and a control circuit which provides a specific signal to each unit pixel of the sensor array region I or controls an output signal of each unit pixel.

In addition, the peripheral circuit region II may include a plurality of CMOS transistors 210 and a logic circuit which includes a signal processing circuit for processing signals.

That is, the peripheral circuit region II may include analog circuits such as the control circuit and the logic circuit.

The image sensor 1 includes a first semiconductor layer 100, a second semiconductor layer 200, a contact wiring 140, an adhesive layer 150, an insulating layer 160, a color filter 170, and microlenses 180.

The first semiconductor layer 100 may be disposed on the second semiconductor layer 200 and electrically connected to the second semiconductor layer 200.

The first semiconductor layer 100 includes a first semiconductor region 101, a first insulating region 102, a first transistor 110, a first wiring layer 121 through 124, a first junction region 130, and photodiodes PD.

The first semiconductor region 101 may be a substrate including a semiconductor material. The substrate may be, e.g., a P-type or N-type bulk substrate, may be formed by growing a P-type or N-type epitaxial layer on a P-type bulk substrate, or may be formed by growing a P-type or N-type epitaxial layer on an N-type bulk substrate. The substrate may also be an organic plastic substrate instead of a semiconductor substrate.

Photoelectric conversion devices, e.g., the photodiodes PD are formed in the first semiconductor region 101 of the sensor array region 1. The photoelectric conversion devices PD may be formed adjacent to a lower surface of the semiconductor region 101, but the inventive concepts are not limited thereto.

The first junction region 130 may be disposed in the first semiconductor region 101 of the peripheral circuit region II. The first junction region 130 may be electrically connected to the first wiring layer 121 through 124.

The first junction region 130 may be electrically connected to the contact wiring 140 and the first transistor 110 by the first wiring layer 121 through 124.

The first junction region 130 may be, but is not limited to, a diode having an NP junction of a P-type well and an N-type diffusion or a diode having an NP junction of an N-type well and a P-type diffusion.

To form the contact wiring 140 which electrically connects the first semiconductor layer 100 and the second semiconductor layer 200, the first junction region 130 may remove electric charges generated when a through-via is formed by plasma etching. That is, the first junction region 130 may induce electric charges generated by plasma etching to the first semiconductor region 101.

Accordingly, this reduces or prevents electric charges generated by plasma etching from being applied to the first transistor 110, thereby protecting the first transistor 110. That is, it is possible to reduce or prevent an analog circuit including the first transistor 110 from being degraded by fine noise.

The first insulating region 102 may be disposed on the lower surface of the first semiconductor region 101 and include an insulating material. The first insulating region 102 may include an interlayer insulating film and the first wiring layer 121 through 124.

The interlayer insulating film may surround the first wiring layer 121 through 124. The interlayer insulating film may include, but is not limited to, at least one of a silicon oxide layer, a silicon nitride layer, a silicon oxynitride layer and combinations of these layers.

The first wiring layer 121 through 124 may include a plurality of wirings formed in the first insulating region 102 of the peripheral circuit region II and stacked, for example stacked sequentially.

Specifically, the first wiring layer 121 through 124 may include a first wiring 121 which is directly and electrically connected to the contact wiring 140, a third wiring 123 which is electrically connected to the first wiring 121, a fourth wiring 124 which is electrically connected to the third wiring 123 and the first junction region 130, and a second wiring 122 which is electrically connected to the fourth wiring 124 and the first transistor 110.

A length L12 of the second wiring 122 may be greater than a length L11 of the first wiring 121. Specifically, the length L12 of the second wiring 122 disposed between the first junction region 130 and the first transistor 110 may be greater than the length L11 of the first wiring 121 disposed between the contact wiring 140 and the first junction region 130.

Therefore, electric charges generated by plasma etching can be effectively induced to the first junction region 130 before being applied to the first transistor 110, thereby effectively protecting the first transistor 110.

In FIG. 4, the second wiring 122 and the third wiring 123 are formed at the same level. However, the second wiring 122 and the third wiring 123 may not necessarily be formed at the same level.

In addition, in FIG. 4, the first wiring layer 121 through 124 includes a stack of four wirings. However, this is merely an example used for ease of description, and the inventive concepts are not limited to this example.

Also, in FIG. 4, the first wiring layer 121 through 124 is formed in the first insulating region 102 of the peripheral circuit region II but is not formed in the first insulating region 102 of the sensor array region I. However, this is merely an example used for ease of description. That is, a plurality of wirings can also be formed in the first insulating region 102 of the sensor array region I.

Each wiring included in the first wiring layer 121 through 124 may include at least one of, but not limited to, aluminum (Al), copper (Cu), and tungsten (W).

The first transistor 110 includes a first gate electrode 111 and first source or drain regions 112 and 113.

The control circuit which provides a specific signal to each unit pixel of the sensor array region I or controls an output signal of each unit pixel may include a plurality of first transistors 110.

The first gate electrode 111 may be disposed in the first insulating region 102 of the peripheral circuit region IL. Specifically, the first gate electrode 111 may be disposed in the first insulating region 102 to be adjacent to the first semiconductor region 101.

The first gate electrode 111 may be, e.g., a gate of a charge transmission device, a gate of a reset device, or a gate of a drive device. In FIG. 4, the first gate electrode 111 is formed in the first insulating region 102. However, the inventive concepts are not limited thereto. That is, in some example embodiments, the first gate electrode 111 may be recessed into the first semiconductor region 101.

The first gate electrode 111 may be electrically insulated from the second wiring 122. However, the inventive concepts are not limited thereto. That is, in some example embodiments, the first gate electrode 111 may be electrically connected to the second wiring 122.

A gap W11 between the contact wiring 140 and the first transistor 110 may be greater than a gap W12 between the contact wiring 140 and the first junction region 130. In addition, a gap W13 between the first junction region 130 and the first transistor 110 may be greater than the gap W12 between the contact wiring 140 and the first junction region 130.

Therefore, electric charges generated by plasma etching can be effectively induced to the first junction region 130 before being applied to the first transistor 110, thereby effectively protecting the first transistor 110.

The first source or drain regions 112 and 113 may be disposed in the first semiconductor region 101 of the peripheral circuit region II. Specifically, the first source or drain regions 112 and 113 may be disposed in the first semiconductor region 101 adjacent to the first insulating region 102. In addition, the first source or drain regions 112 and 113 may be disposed on both sides of the first gate electrode 111.

The first source or drain regions 112 and 113 may be electrically connected to the first wiring layer 121 through 124. However, the inventive concepts are not limited thereto. That is, in some example embodiments, the first source or drain regions 112 and 113 may be electrically insulated from the first wiring layer 121 through 124.

The second semiconductor layer 200 may be disposed under the first semiconductor layer 100 and electrically connected to the first semiconductor layer 100.

The second semiconductor layer 200 includes a second semiconductor region 201, a second insulating region 202, a second transistor 210, a second wiring layer 221 through 224, and a second junction 230.

The second semiconductor region 201 may be or include a substrate including a semiconductor material. The substrate may be, e.g., a P-type or N-type bulk substrate, may be formed by growing a P-type or N-type epitaxial layer on a P-type bulk substrate, or may be formed by growing a P-type or N-type epitaxial layer on an N-type bulk substrate. The substrate may also be or include an organic plastic substrate instead of a semiconductor substrate.

The second junction region 230 may be disposed in the second semiconductor region 201 of the peripheral circuit region II. The second junction region 230 may be electrically connected to the second wiring layer 221 through 224.

The second junction region 230 may be electrically connected to the contact wiring 140 and the second transistor 210 by the second wiring layer 221 through 224.

The second junction region 230 may be, but is not limited to, a diode having an NP junction of a P-type well and an N-type diffusion or a diode having an NP junction of an N-type well and a P-type diffusion.

To form the contact wiring 140 which electrically connects the second semiconductor layer 200 and the first semiconductor layer 100, the second junction region 230 may remove electric charges generated when a through-via is formed by plasma etching. That is, the second junction region 230 may induce electric charges generated by plasma etching to the second semiconductor region 201.

Accordingly, this reduces or prevents electric charges generated by plasma etching from being applied to the second transistor 210, thereby protecting the second transistor 210. That is, it is possible to reduce or prevent an analog circuit including the second transistor 210 from being degraded by fine noise.

The second insulating region 202 may be disposed on an upper surface of the second semiconductor region 201 and include an insulating material. The second insulating region 202 may include an interlayer insulating film and the second wiring layer 221 through 224.

The interlayer insulating film may surround the second wiring layer 221 through 224. The interlayer insulating film may include, but is not limited to, at least one of a silicon oxide layer, a silicon nitride layer, a silicon oxynitride layer and combinations of these layers.

The second wiring layer 221 through 224 may include a plurality of wirings formed in the second insulating region 202 of the peripheral circuit region II and stacked, for example stacked sequentially.

Specifically, the second wiring layer 221 through 224 may include a fifth wiring 221 which is connected, for example directly and electrically connected to the contact wiring 140, a seventh wiring 223 which is electrically connected to the fifth wiring 221, an eighth wiring 224 which is electrically connected to the seventh wiring 223 and the second junction region 230, and a sixth wiring 222 which is electrically connected to the eighth wiring 224 and the second transistor 210.

A length L22 of the sixth wiring 222 may be greater than a length L21 of the fifth wiring 221. Specifically, the length L22 of the sixth wiring 222 disposed between the second junction region 230 and the second transistor 210 may be greater than the length L21 of the fifth wiring 221 disposed between the contact wiring 140 and the second junction region 230.

Therefore, electric charges generated by plasma etching can be effectively induced to the second junction region 230 before being applied to the second transistor 210, thereby effectively protecting the second transistor 210.

In FIG. 4, the sixth wiring 222 and the seventh wiring 223 are formed at the same level. However, the sixth wiring 222 and the seventh wiring 223 may not necessarily be formed at the same level.

In addition, in FIG. 4, the second wiring layer 221 through 224 includes a stack of four wirings. However, this is merely an example used for ease of description, and the inventive concepts are not limited to this example.

Also, in FIG. 4, the second wiring layer 221 through 224 is formed in the second insulating region 202 of the peripheral circuit region II but is not formed in the second insulating region 202 of the sensor array region I. However, this is merely an example used for ease of description. That is, a plurality of wirings can also be formed in the second insulating region 202 of the sensor array region I.

Each, or at least one, wiring included in the second wiring layer 221 through 224 may include at least one of, but not limited to, aluminum (Al), copper (Cu), and tungsten (W).

The second transistor 210 includes a second gate electrode 211 and second source or drain regions 212 and 213.

The logic circuit including the signal processing circuit configured to provide a specific signal to each unit pixel of the sensor array region I or processes each signal may include a plurality of second transistors 210.

The second gate electrode 211 may be disposed in the second insulating region 202 of the peripheral circuit region II. Specifically, the second gate electrode 211 may be disposed in the second insulating region 202 to be adjacent to the second semiconductor region 201.

The second gate electrode 211 may be, e.g., a gate of a charge transmission device, a gate of a reset device, or a gate of a drive device. In FIG. 4, the second gate electrode 211 is formed in the second insulating region 202. However, the inventive concepts are not limited thereto. That is, in some example embodiments, the second gate electrode 211 may be recessed into the second semiconductor region 201.

The second gate electrode 211 may be electrically connected to the sixth wiring 222. Specifically, the second gate electrode 211 may be electrically connected to the second wiring layer 221 through 224 and may be electrically connected to the first semiconductor layer 100 by the contact wiring 140. However, the inventive concepts are not limited thereto. That is, in some example embodiments, the second gate electrode 211 may be electrically insulated from the sixth wiring 222.

A gap W21 between the contact wiring 140 and the second transistor 210 may be greater than a gap W22 between the contact wiring 140 and the second junction region 230. In addition, a gap W23 between the second junction region 230 and the second transistor 210 may be greater than the gap W22 between the contact wiring 140 and the second junction region 230.

Therefore, electric charges generated by plasma etching can be effectively induced to the second junction region 230 before being applied to the second transistor 210, thereby effectively protecting the second transistor 210.

The second source or drain regions 212 and 213 may be disposed in the second semiconductor region 201 of the peripheral circuit region II. Specifically, the second source or drain regions 212 and 213 may be disposed in the second semiconductor region 201 adjacent to the second insulating region 202. In addition, the second source or drain regions 212 and 213 may be disposed on both sides of the second gate electrode 211.

The second source or drain regions 212 and 213 may be electrically insulated from the second wiring layer 221 through 224. However, the inventive concepts are not limited thereto.

That is, in some example embodiments, the second source or drain regions 212 and 213 may be electrically connected to the second wiring layer 221 through 224.

The adhesive layer 150 may be disposed between the first semiconductor layer 100 and the second semiconductor layer 200 to stick the first semiconductor layer 100 and the second semiconductor layer 200 together.

Specifically, the adhesive layer 150 may be disposed between the first insulation region 102 of the first semiconductor layer 100 and the second insulating region 202 of the second semiconductor layer 200 and stick the first insulating region 102 and the second insulating region 202 together.

The insulating layer 160 may be disposed on the first semiconductor layer 100. Specifically, the insulating layer 160 may be disposed on the first semiconductor region 101.

The insulating layer 160 may include an oxide insulating layer or a nitride insulating layer. When including hafnium oxide (HfOx), the insulating layer 160 may reduce dark currents of the image sensor 1.

The contact wiring 140 may penetrate the insulating layer 160, the first semiconductor layer 100, the adhesive layer 150, and part of the second insulating region 202.

The contact wiring 140 may be electrically connected to the first wiring 121 of the first wiring layer and the fifth wiring 221 of the second wiring layer. Accordingly, the first semiconductor layer 100 and the second semiconductor layer 200 may be electrically connected to each other by the contact wiring 140.

The color filter 170 may be disposed on the insulating layer 160 in the sensor array region 1. The color filter 170 may include a red color filter, a green color filter and a blue color filter.

The microlenses 180 may be disposed on the color filter 170 in the sensor array region I. The microlenses 180 may be made of or include an organic material such as photosensitive resin or an inorganic material.

Although not illustrated in FIG. 4, various layers including a light-blocking layer for blocking light from entering the optical black sensor region may further be formed on the insulating layer 160 formed in the optical black sensor region of the sensor array region I.

Generally, during plasma etching, the amount of electric charge generated increases in proportion to etching time. Accordingly, a transistor included in an analog circuit is degraded by fine noise.

The image sensor 1 according to the example embodiment is a stack-type image sensor in which a first semiconductor layer and a second semiconductor layer are stacked. In the image sensor, to electrically connect the first semiconductor layer and the second semiconductor layer, electric charges generated when a through-via is formed by plasma etching are removed using a junction region, thereby protecting transistors included in the first and second semiconductor layers.

In this case, a first junction region may be disposed in the first semiconductor layer including a control circuit and a pixel array to protect the control circuit from electric charges. In addition, a second junction region may be disposed in the second semiconductor layer including a logic circuit to protect the logic circuit from electric charges.

That is, electric charges generated by plasma etching are removed using the first and second junction regions, thereby reducing or preventing the degradation of analog circuits, such as the control circuit and the logic circuit, by fine noise.

A method for fabricating an image sensor according to an example embodiment will now be described with reference to FIG. 5 to FIG. 10.

FIG. 5 to FIG. 10 illustrate steps of a method for fabricating an image sensor according to an example embodiment.

Figure 5:
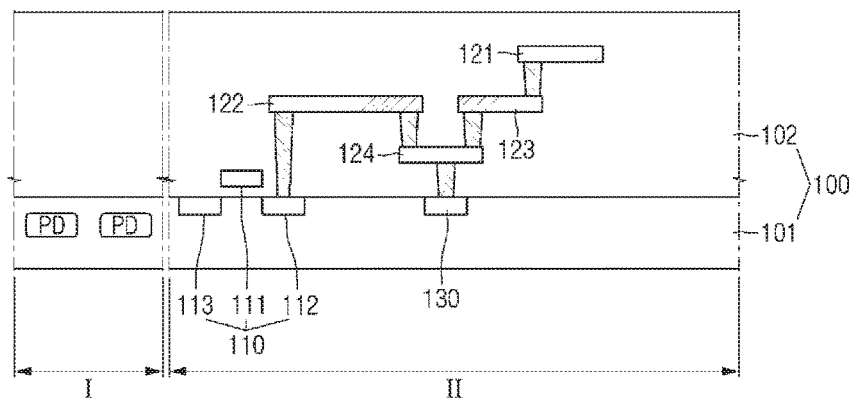
FIG. 5 to FIG. 10 illustrate steps of a method for fabricating an image sensor according to an example embodiment.

Referring to FIG. 5, a sensor array region I and a peripheral circuit region II are defined in a first semiconductor layer 100.

A plurality of unit pixels are formed in a first semiconductor region 101 of the sensor array region I. To form the unit pixels, photoelectric conversion devices PD such as photodiodes and a plurality of impurity diffusion regions are formed in the first semiconductor region 101 of the sensor array region I.

A first gate electrode 111 is formed in a first insulating region 102 of the peripheral circuit region II, and first source or drain regions 112 and 113 are formed in the first semiconductor region 101 of the peripheral circuit region II.

In addition, a first junction region 130 is formed in the first semiconductor region 101 of the peripheral circuit region II.

Then, a first wiring layer 121 through 124 which electrically connects the first source or drain regions 112 and 113 to the first junction region 130 is formed in the first insulating region 102 of the peripheral circuit region II, and an interlayer insulating film is formed in the first insulating region 102 of the peripheral circuit region II to surround the first gate electrode 111 and the first wiring layer 121 through 124.

In some example embodiments, the interlayer insulating film may include multiple layers. In the sensor array region I and the peripheral circuit region 11, layers disposed at the same level among first through fourth wirings 121 through 124 may be formed in the same process.

In some example embodiments, the interlayer insulating film may be made of or include at least one of flowable oxide (FOX), high density plasma (HDP) oxide, tonen silazene (TOSZ), spin on glass (SOG), and undoped silica glass (USG).

Figure 6:
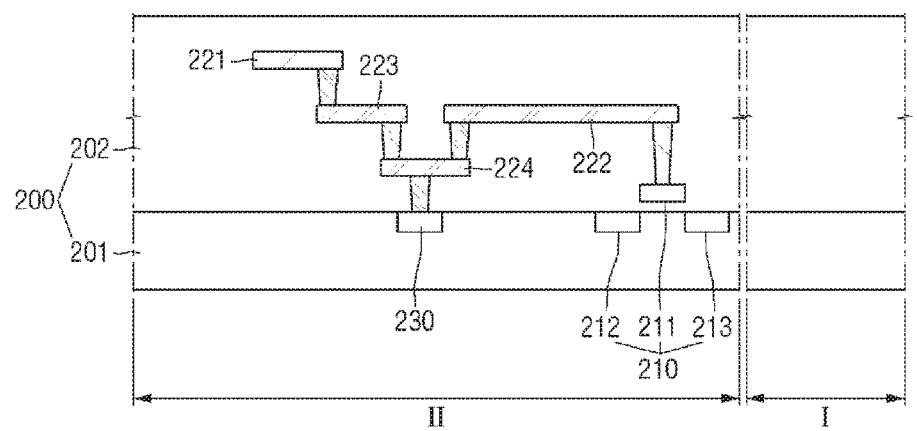

Referring to FIG. 6, the sensor array region I and the peripheral circuit region II are defined in a second semiconductor layer 200.

A second gate electrode 211 is formed in a second insulating region 202 of the peripheral circuit region II, and second source or drain regions 212 and 213 are formed in a second semiconductor region 201 of the peripheral circuit region II.

In addition, a second junction region 230 is formed in the second semiconductor region 201 of the peripheral circuit region II.

Then, a second wiring layer 221 through 224 which electrically connects the second gate electrode 211 and the second junction region 230 to the second insulating region 202 is formed in the second insulating region 202 of the peripheral circuit region II, and an interlayer insulating film is formed in the second insulating region 202 of the peripheral circuit region II to surround the second gate electrode 211 and the second wiring layer 221 through 224.

In some example embodiments, the interlayer insulating film may include multiple layers. In the sensor array region I and the peripheral circuit region II, layers disposed at the same level among fifth through eighth wirings 221 through 224 may be formed in the same process.

Figure 7:
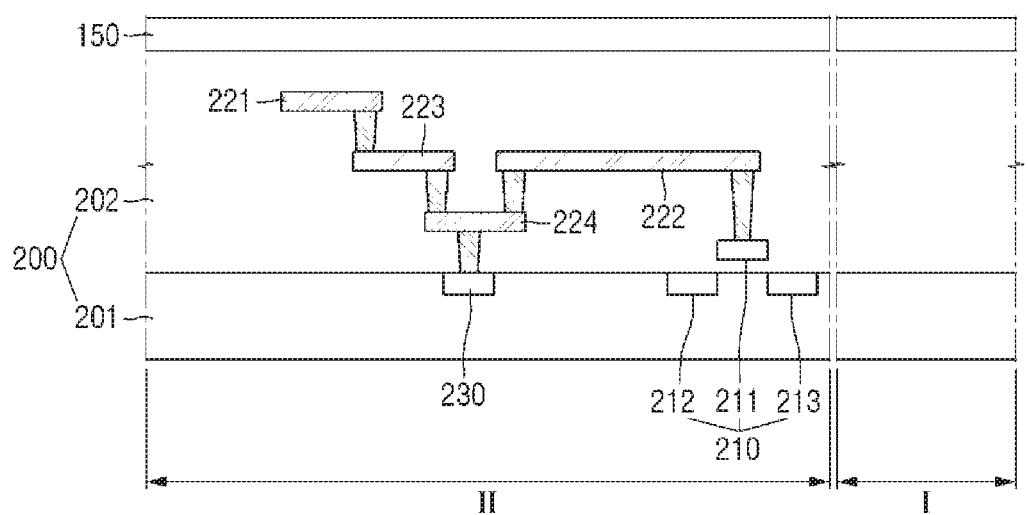

Next, referring to FIG. 7, an adhesive layer 150 is formed on the second insulating region 202 of the second semiconductor layer 200.

Figure 8:
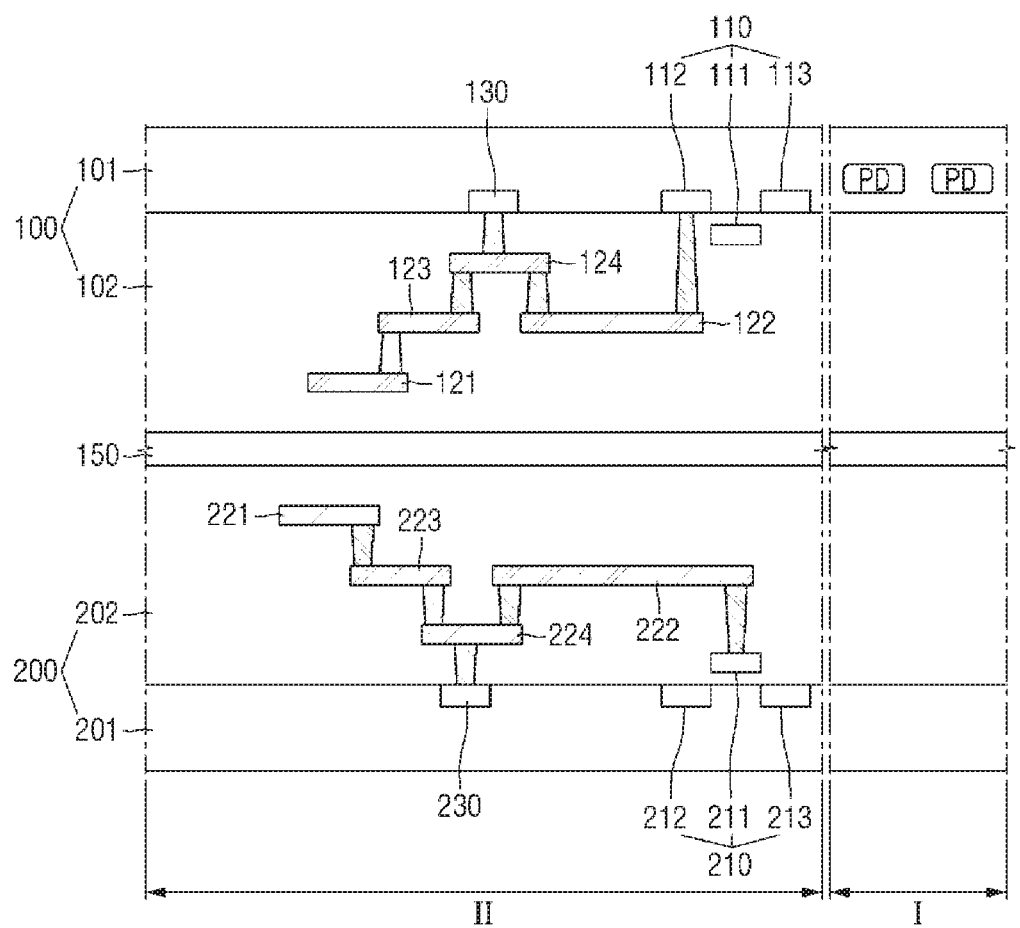

Referring to FIG. 8, the first semiconductor layer 100 is attached onto the adhesive layer 150. Specifically, the first insulating region 102 of the first semiconductor layer 100 is placed to face the second insulating region 202 of the second semiconductor layer 200 and then attached onto the second insulating region 202 using the adhesive layer 150.

Figure 9:
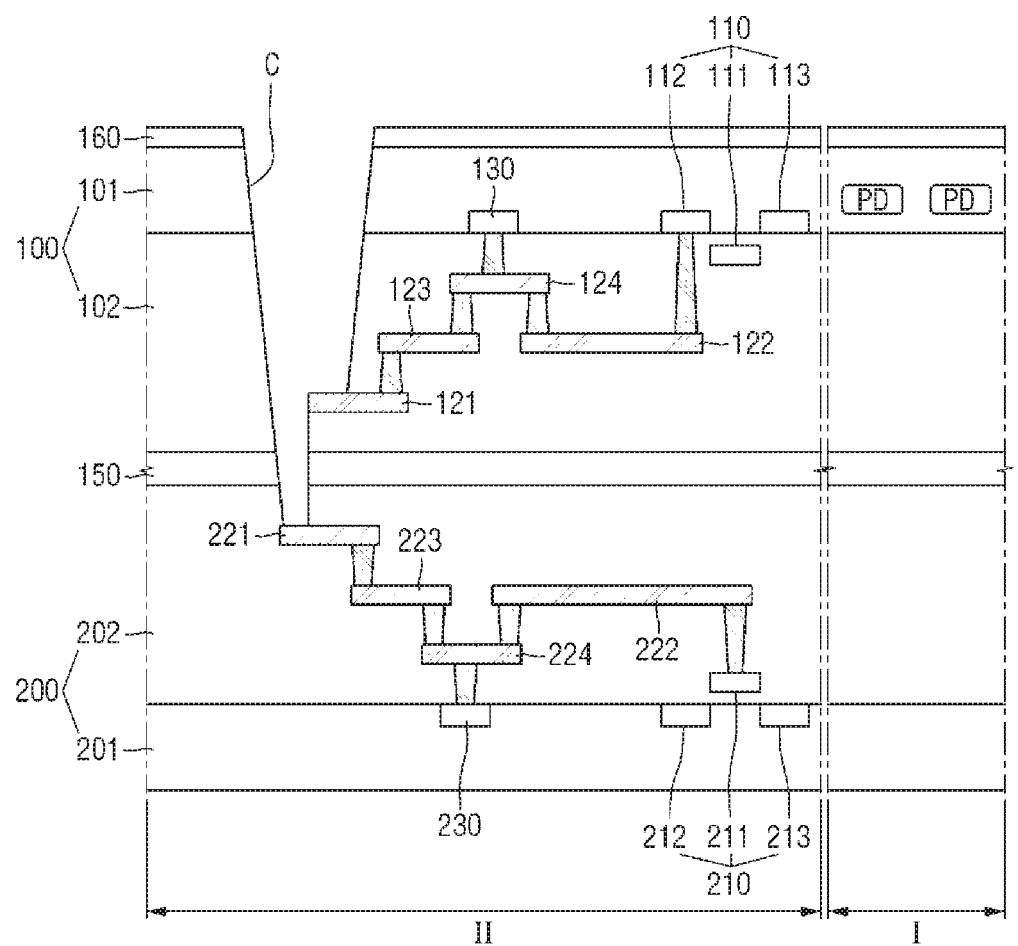

Referring to FIG. 9, an insulating layer 160 including an oxide insulating layer or a nitride insulating layer is formed on the first semiconductor region 101 of the first semiconductor layer 100.

Then, a through-via C is formed by plasma-etching the insulating layer 160, the first semiconductor region 101, the first insulating region 102, the adhesive layer 150 and part of the second insulating region 202 in the peripheral circuit region II.

Specifically, the through-via C which exposes part of the first wiring 121 and part of the fifth wiring 221 is formed by plasma-etching the insulating layer 160, the first semiconductor region 101, the first insulating region 102, the adhesive layer 150 and part of the second insulating region 202 in the peripheral circuit region II using an etch mask pattern, and then the etch mask pattern is removed.

That is, part of the first wiring 121 and part of the fifth wiring 221 may be exposed inside one through-via C using a plasma etching process.

In this case, electric charges generated in the plasma etching process may be induced to the first junction region 130 through the first wiring 121, the third wiring 123 and the fourth wiring 124. In addition, the electric charges may be induced to the second junction region 230 through the fifth wiring 221, the seventh wiring 223 and the eighth wiring 224.

Accordingly, the application of the electric charges to a first transistor 110 and a second transistor 210 can be reduced or prevented, thereby protecting the first transistor 110 and the second transistor 210.

Figure 10:
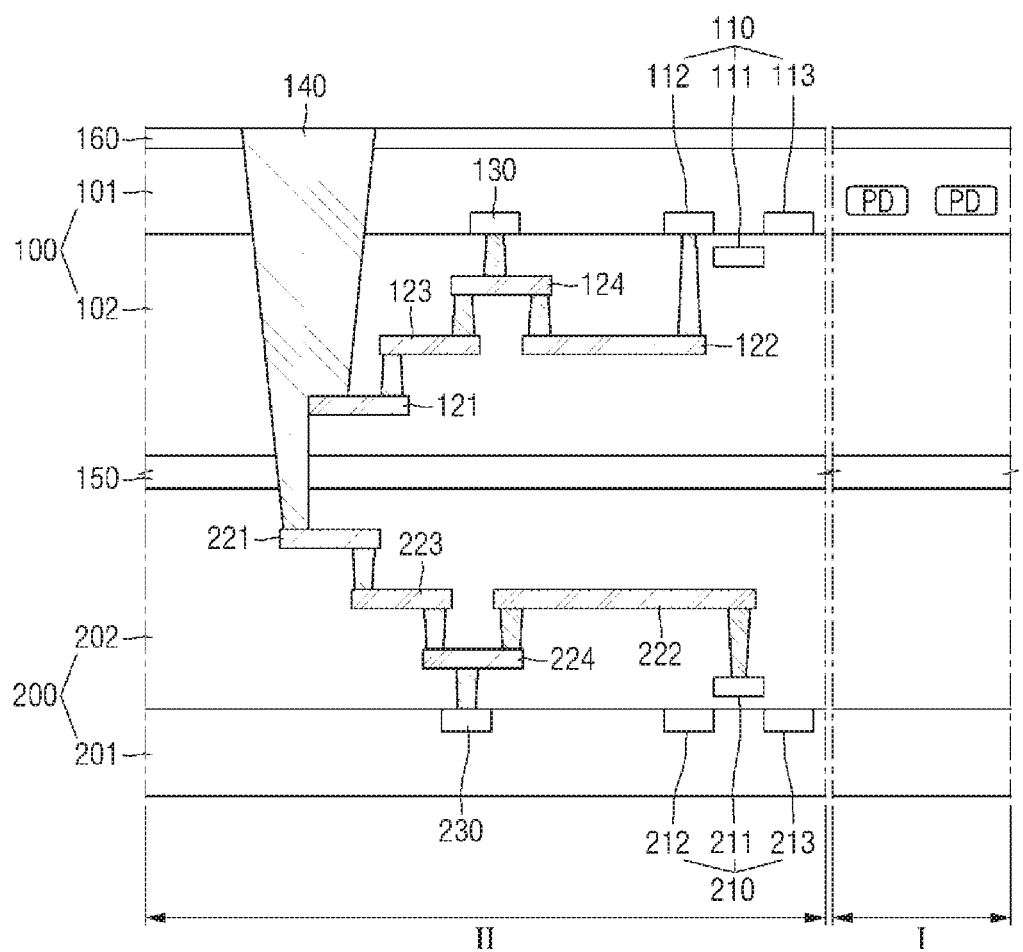

Referring next to FIG. 10, a contact wiring 140 including a conductive material is formed in the through-via C. In FIG. 10, an upper surface of the contact wiring 140 and an upper surface of the insulating layer 160 lie in the same plane. However, the inventive concepts are not limited thereto. That is, in some example embodiments, the upper surface of the contact wiring 140 may be higher than the upper surface of the insulating layer 160.

In subsequent processes, a color filter 170 and microlenses 180 may be sequentially formed on the insulating layer 160 of the sensor array region I as illustrated in FIG. 4.

An image sensor according to an example embodiment will now be described with reference to FIG. 11. The following description will focus on differences with the image sensor 1 of FIG. 4.

Figure 11:
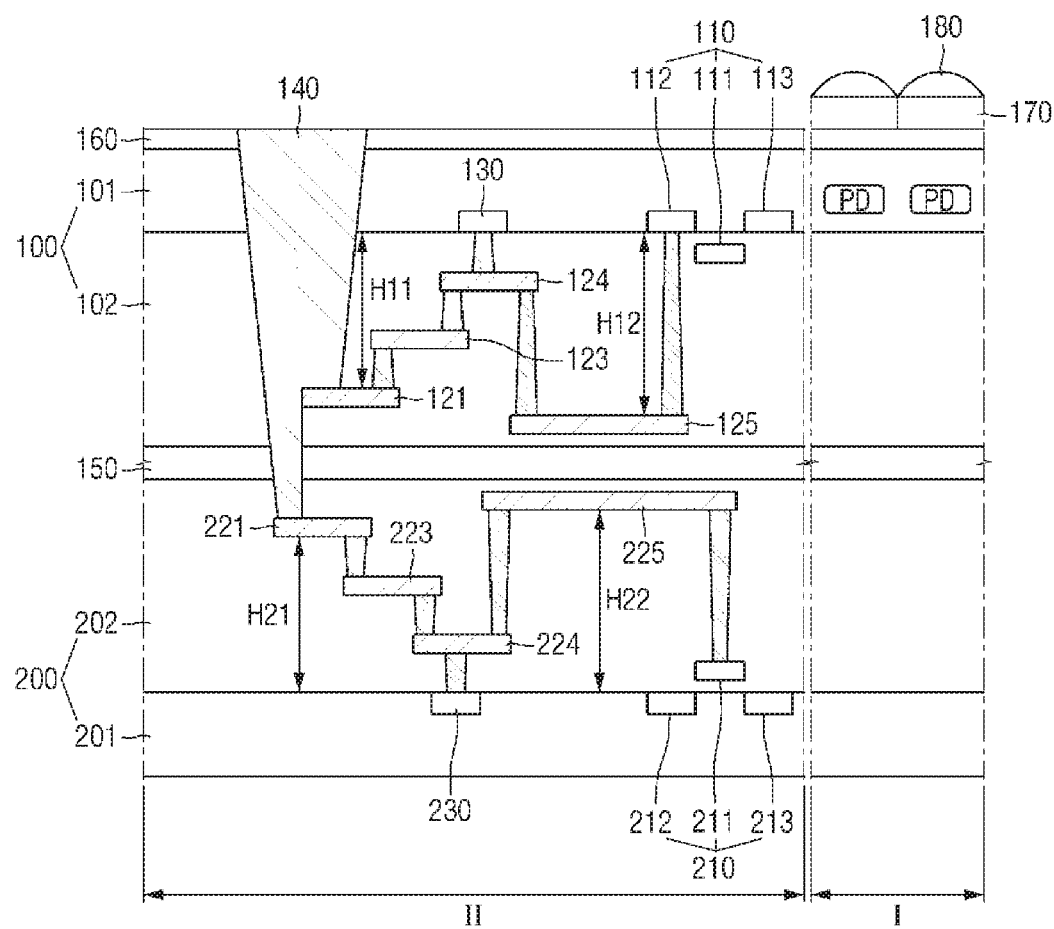
FIG. 11 illustrates an image sensor according to an example embodiment.

FIG. 11 illustrates an image sensor 2 according to an example embodiment.

Referring to FIG. 11, in the image sensor 2, unlike in the image sensor 1 of FIG. 4, a first wiring 121 is disposed closer to a first semiconductor region 101 than a ninth wiring 125 which connects a fourth wiring 124 and a first transistor 110. In addition, a fifth wiring 221 is disposed closer to a second semiconductor region 201 than a tenth wiring 225 which connects an eighth wiring 224 and a second transistor 210.

Specifically, a height H12 of the ninth wiring 125 from the first semiconductor region 101 is greater than a height H11 of the first wiring 121 from the first semiconductor region 101. In addition, a height H22 of the tenth wiring 225 from the second semiconductor region 201 is greater than a height H21 of the fifth wiring 221 from the second semiconductor region 201.

In this case, when a first wiring layer 121 through 125 is formed, the ninth wiring 125 may be formed last. Therefore, in the process of forming the first wiring 121, a third wiring 123 and the fourth wiring 124, electric charges generated by plasma etching may be induced to a first junction region 130, thereby reducing or preventing the application of the electric charges to the first transistor 110.

In addition, when a second wiring layer 221 through 225 is formed, the tenth wiring 225 may be formed last. Therefore, in the process of forming the fifth wiring 221, a seventh wiring 223 and the eighth wiring 224, electric charges generated by plasma etching may be induced to a second junction region 230, thereby reducing or preventing the application of the electric charges to the second transistor 210.

An image sensor according to an example embodiment will now be described with reference to FIG. 12. The following description will focus on differences with the image sensor 1 of FIG. 4.

Figure 12:
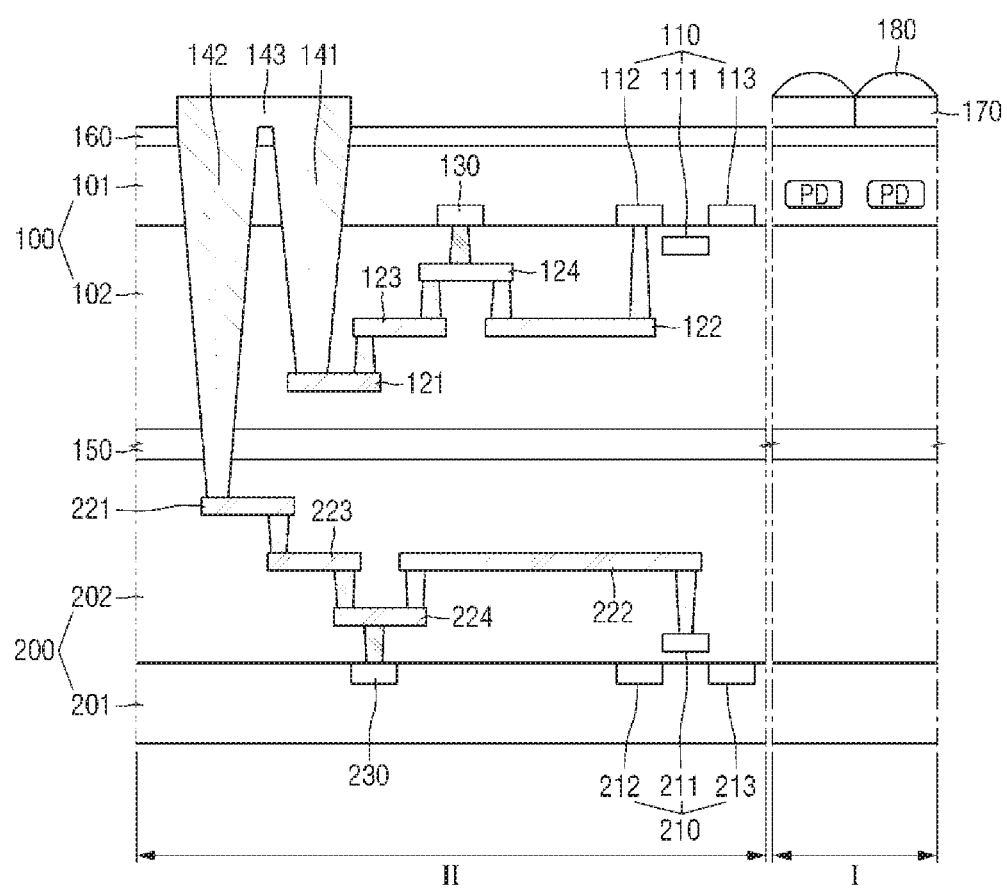
FIG. 12 illustrates an image sensor according to an example embodiment.

FIG. 12 illustrates an image sensor 3 according to an example embodiment.

Referring to FIG. 12, the image sensor 3, unlike the image sensor 1 of FIG. 4, includes a first contact wiring 141, a second contact wiring 142, and a connecting wiring 143.

Specifically, the first contact wiring 141 may penetrate an insulating layer 160, a first semiconductor region 101 and part of a first insulating region 102 and may be electrically connected to a first wiring layer 121 through 124.

In addition, the second contact wiring 142 may penetrate the insulating layer 160, the first semiconductor region 101, the first insulating region 102, an adhesive layer 150 and part of a second insulating region 202 and may be electrically connected to a second wiring layer 221 through 224.

The connecting wiring 143 may be disposed on the insulating layer 160 and electrically connect the first contact wiring 141 and the second contact wiring 142. In FIG. 12, the connecting wiring 143 is disposed on the insulating layer 160. However, the inventive concepts are not limited thereto. That is, in some example embodiments, an upper surface of the connecting wiring 143 and an upper surface of the insulating layer 160 may lie in the same plane.

A method for fabricating an image sensor according to an example embodiment will now be described with reference to FIG. 13 and FIG. 14.

Figure 13:
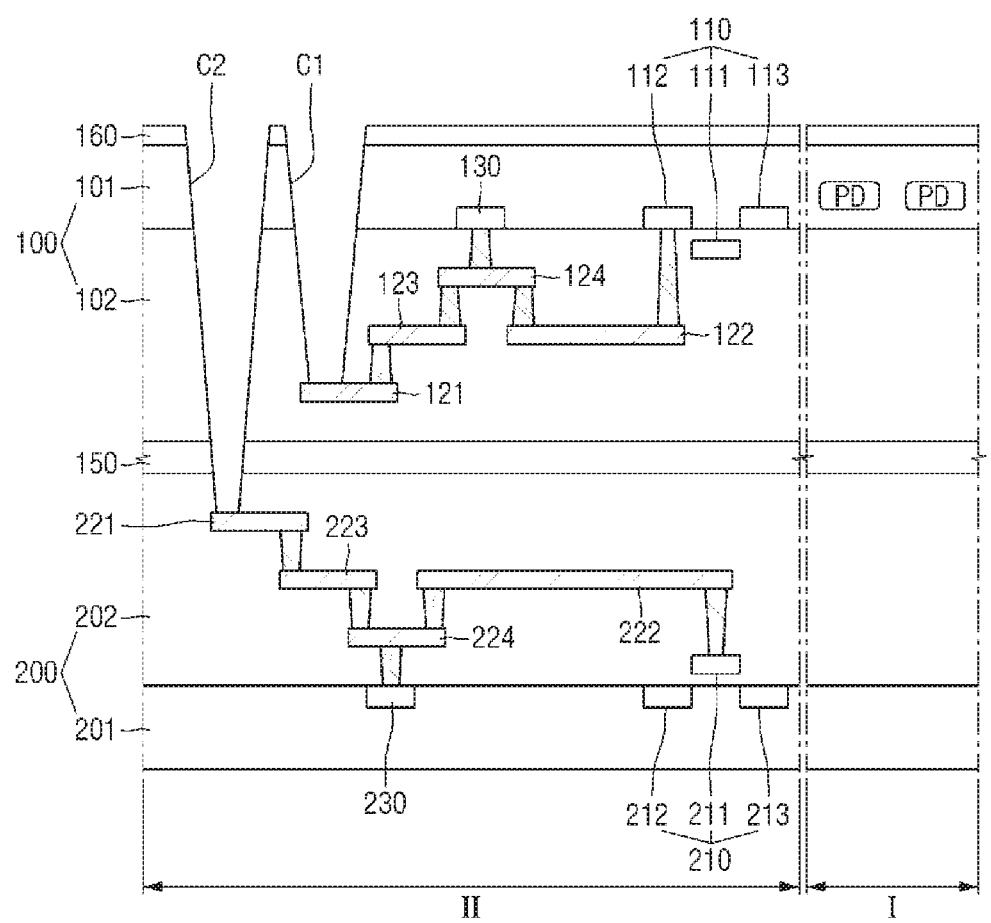
FIG. 13 and FIG. 14 illustrate steps of a method for fabricating an image sensor according to an example embodiment.
Figure 14:
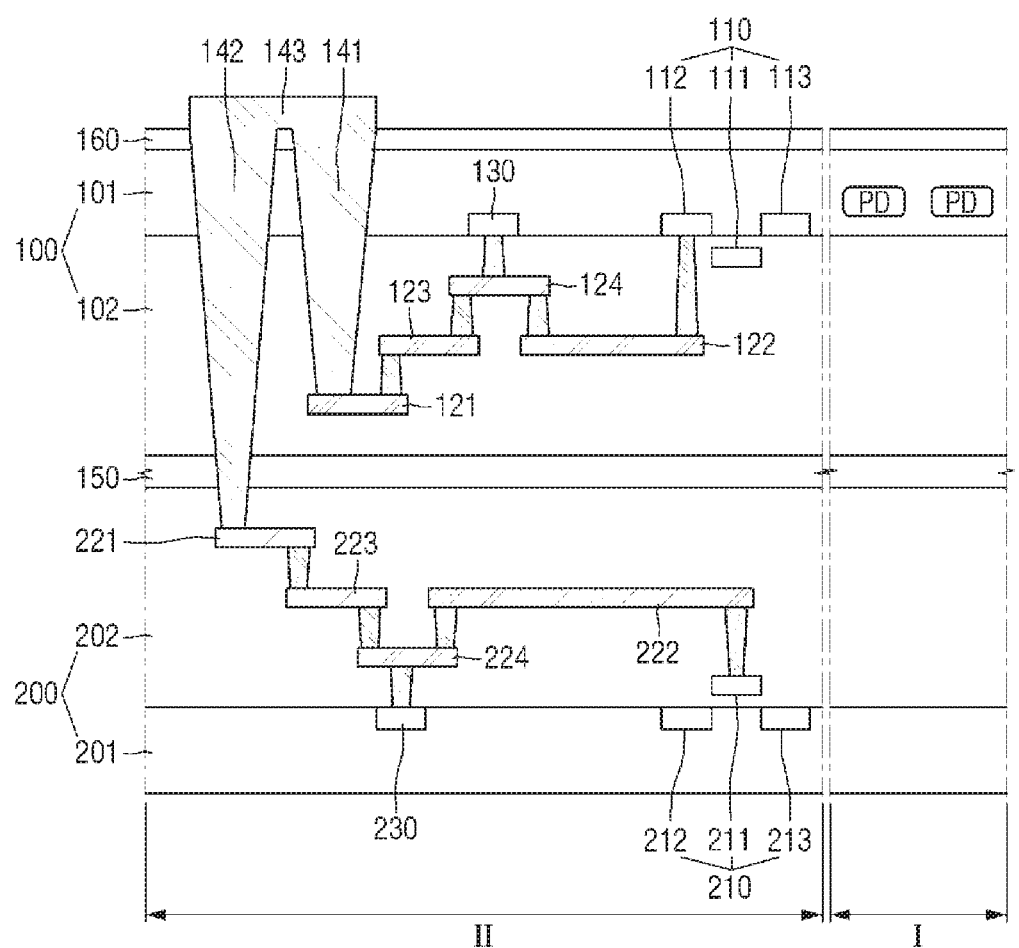

FIG. 13 and FIG. 14 illustrate steps of a method for fabricating an image sensor according to an example embodiment.

Referring to FIG. 13, after the process of FIG. 8, an insulating layer 160 including an oxide insulating layer or a nitride insulating layer is formed on a first semiconductor region 101 of a first semiconductor layer 100.

Then, the insulating layer 160, the first semiconductor region 101 and part of a first insulating region 102 in a peripheral circuit region II are plasma-etched to form a first through-via C1 which exposes part of a first wiring 121.

In addition, the insulating layer 160, the first semiconductor region 101, the first insulating region 102, an adhesive layer 150, and part of a second insulating region 202 in the peripheral circuit region II are plasma-etched to form a second through-via C2 which exposes part of a fifth wiring 221.

Referring next to FIG. 14, a first contact wiring 141 including a conductive material is formed in the first through-via C1, and a second contact wiring 142 including a conductive material is formed in the second through-via C2. Then, a connecting wiring 143 which electrically connects the first contact wiring 141 and the second contact wiring 142 is formed.

Accordingly, the first semiconductor layer 100 and a second semiconductor layer 200 may be electrically connected to each other.

An image sensor according to an example embodiment will now be described with reference to FIG. 15. The following description will focus on differences with the image sensor 1 of FIG. 4.

Figure 15:
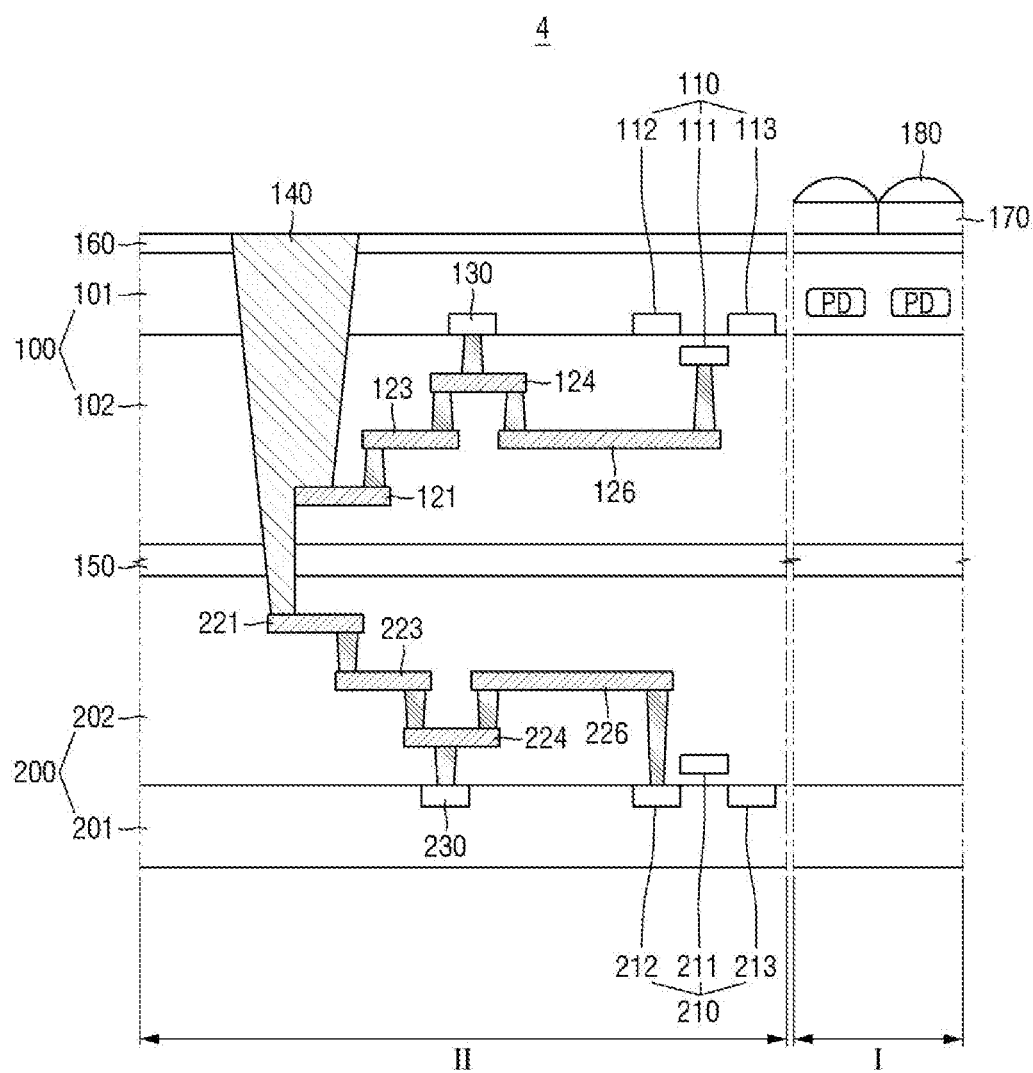
FIG. 15 illustrates an image sensor according to an example embodiment.

FIG. 15 illustrates an image sensor 4 according to an example embodiment.

Referring to FIG. 15, in the image sensor 4, unlike in the image sensor 1 of FIG. 4, a first wiring layer 121, 123, 124 and 126 may be electrically connected to a first gate electrode 111. In addition, a second wiring layer 221, 223, 224 and 226 may be electrically connected to second source or drain regions 212 and 213.

That is, the first gate electrode 111 of a first transistor 110 and the second source or drain regions 212 and 213 of a second transistor 2120 may be electrically connected to each other.

An image sensor according to an example embodiment will now be described with reference to FIG. 16. The following description will focus on differences with the image sensor 1 of FIG. 4.

Figure 16:
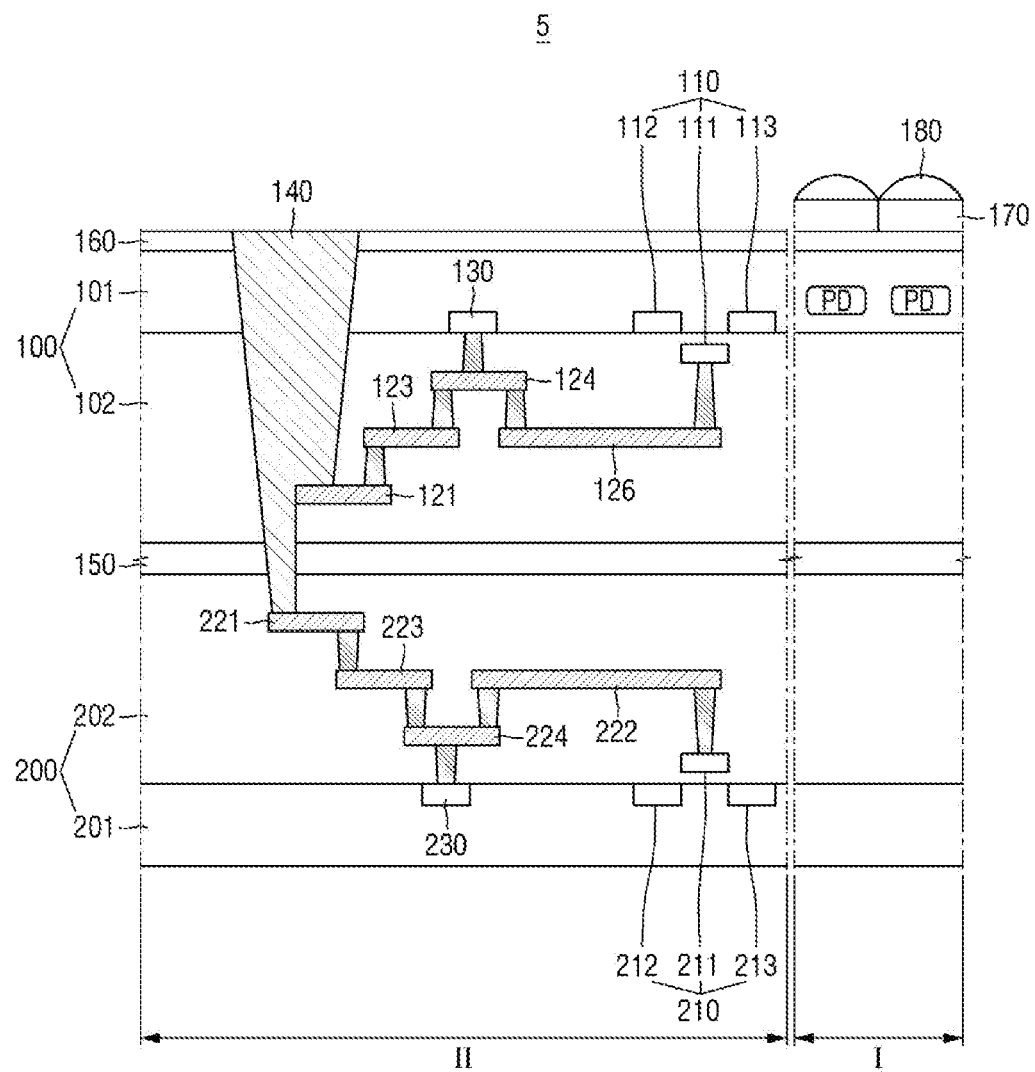
FIG. 16 illustrates an image sensor according to an example embodiment.

FIG. 16 illustrates an image sensor 5 according to an example embodiment.

Referring to FIG. 16, in the image sensor 5, unlike in the image sensor 1 of FIG. 4, a first wiring layer 121, 123, 124 and 126 may be electrically connected to a first gate electrode 111. In addition, a second wiring layer 221 through 224 may be electrically connected to a second gate electrode 211.

That is, the first gate electrode 111 of a first transistor 110 and the second gate electrode 211 of a second transistor 210 may be electrically connected to each other.

While the inventive concepts have been particularly shown and described with reference to some example embodiments thereof, it will be understood by those of ordinary skill in the art that various changes in form and detail may be made therein without departing from the spirit and scope of the inventive concepts as defined by the following claims. The example embodiments should be considered in a descriptive sense only and not for purposes of limitation.

What is claimed is:

1. An image sensor comprising:
   a first semiconductor layer including a first semiconductor region containing a semiconductor material and a first insulating region containing an insulating material; and
   a second semiconductor layer under the first semiconductor layer and including a second semiconductor region containing the semiconductor material and a second insulating region containing the insulating material,
   the first semiconductor layer including a first transistor having first source or drain regions in the first semiconductor region and a first gate electrode in the first insulating region, a contact wiring in the first semiconductor layer, a first wiring layer which electrically connects the contact wiring and the first transistor in the first insulating region, and a first junction region in the first semiconductor region and electrically connected to the first wiring layer,
   the second semiconductor layer including a second transistor having second source or drain regions in the second semiconductor region and a second gate electrode in the second insulating region, a second wiring layer which electrically connects the contact wiring and the second transistor, the second wiring layer being in the second insulating region, and a second junction region in the second semiconductor region and electrically connected to the second wiring layer.

2. The image sensor of claim 1, wherein a gap between the contact wiring and the first transistor is greater than a gap between the contact wiring and the first junction region, and a gap between the contact wiring and the second transistor is greater than a gap between the contact wiring and the second junction region.

3. The image sensor of claim 1, wherein a gap between the first junction region and the first transistor is greater than a gap between the contact wiring and the first junction region, and a gap between the second junction region and the second transistor is greater than a gap between the contact wiring and the second junction region.

4. The image sensor of claim 1, wherein the first wiring layer comprises:
a first wiring directly connected to the contact wiring and electrically connects the contact wiring and the first junction region; and
a second wiring directly connected to the first transistor and electrically connects the first junction region and the first transistor,
wherein the second wiring is longer than the first wiring.

5. The image sensor of claim 4, wherein the first wiring is closer to the first semiconductor region than the second wiring.

6. The image sensor of claim 1, wherein the contact wiring is in a through-via which exposes part of the first wiring layer and part of the second wiring layer.

7. The image sensor of claim 6, wherein the first and second junction regions are configured to remove electric charges generated when the through-via is formed using plasma etching.

8. The image sensor of claim 1, wherein the contact wiring comprises:
a first contact wiring in a first through-via exposing part of the first wiring layer and is electrically connected to the first wiring layer;
a second contact wiring in a second through-via exposing part of the second wiring layer and is electrically connected to the second wiring layer; and
a connecting wiring which connects the first contact wiring and the second contact wiring.

9. The image sensor of claim 1, wherein the first insulating region and the second insulating region face each other;
the image sensor further comprising:
an adhesive layer between the first insulating region and the second insulating region.

10. The image sensor of claim 1, wherein the first and second junction regions are configured to remove electric charges generated when the first and second wiring layers are formed using plasma etching.

11. An image sensor comprising:
a first semiconductor layer having a first semiconductor region containing a semiconductor material and a first insulating region containing an insulating material;
a second semiconductor layer having a second semiconductor region containing the semiconductor material and a second insulating region containing the insulating material, the second insulating region being adjacent to the first insulating region; and
a contact wiring which electrically connects the first semiconductor layer and the second semiconductor layer,
the first semiconductor layer including a first wiring layer in the first insulating region, a first junction region in the first semiconductor region and electrically connected to the first wiring layer, and first source or drain regions in the first semiconductor region and electrically connected to the first wiring layer,
the second semiconductor layer including a second wiring layer in the second insulating region, a second junction region in the second semiconductor region and electrically connected to the second wiring layer, and second source or drain regions in the second semiconductor region and electrically insulated from the second wiring layer.

12. The image sensor of claim 11, further comprising:
an adhesive layer between the first insulating region and the second insulating region.

13. The image sensor of claim 12, wherein the contact wiring penetrates the first semiconductor layer, the adhesive layer and part of the second insulating region and electrically connects the first wiring layer and the second wiring layer.

14. The image sensor of claim 11, further comprising:
a first gate electrode in the first insulating region and electrically insulated from the first wiring layer; and
a second gate electrode in the second insulating region and electrically connected to the second wiring layer.

15. The image sensor of claim 14, wherein
the first junction region is between the first gate electrode and the contact wiring, and
the second junction region is between the second gate electrode and the contact wiring.

* * * * *